United States Patent [19]

Jeenicke et al.

[11] 4,321,548

[45] Mar. 23, 1982

[54] FREQUENCY-VOLTAGE AND VOLTAGE-FREQUENCY CONVERTERS

[75] Inventors: Edmund Jeenicke, Schwieberdingen; Winfried Klotzner, Maulbronn; Peter Dilger, Markgroningen, all of Fed. Rep. of Germany

[73] Assignee: Robert Bosch GmbH, Stuttgart, Fed. Rep. of Germany

[21] Appl. No.: 107,357

[22] Filed: Dec. 26, 1979

[30] Foreign Application Priority Data

Jan. 4, 1979 [DE] Fed. Rep. of Germany ....... 2900192

[51] Int. Cl.³ .................... H03K 5/01; H03K 13/01
[52] U.S. Cl. .................... 328/143; 328/26; 328/14; 307/519; 340/347 M
[58] Field of Search ............ 328/14, 26, 142, 143, 328/144, 145; 340/347 M; 331/1 R, 1 H, 17, 18; 307/519

[56] References Cited

U.S. PATENT DOCUMENTS

| | | | |
|---|---|---|---|
| 3,528,033 | 9/1970 | Hunt et al. | 331/1 R |
| 3,579,281 | 5/1971 | Kam | 331/1 A |
| 3,852,681 | 12/1974 | Underhill | 331/1 R |
| 3,992,680 | 11/1976 | Herzz | 328/14 X |
| 4,115,810 | 9/1978 | Mikado | 328/14 X |
| 4,185,247 | 1/1980 | Harrison | 328/14 X |

*Primary Examiner*—John S. Heyman
*Attorney, Agent, or Firm*—Frishauf, Holtz, Goodman & Woodward

[57] ABSTRACT

A nonlinear characteristic curve of a frequency-voltage converter is approximated by summing the outputs of energized ones of a plurality of either voltage or current sources. The current sources are energized and de-energized in accordance with information contained in storage elements which may, for example, be parts of a shift register, or of an addressable storage. The breaks in the characteristic curve are achieved by changing the number of energized current sources or the current supplied by at least some of the sources at time intervals $Ti=1/fi$, where fi are the break frequencies and where time is measured starting with the leading edge of each pulse of the pulse frequence having the frequency $f_x$ which is to be converted to a voltage. Voltage-frequency converters can be created by connecting the frequency-voltage converter into the feedback path of a converter circuit receiving a voltage $U_x$ and furnishing the frequency $f_x$ in response thereto.

5 Claims, 7 Drawing Figures

FREQUENCY-VOLTAGE AND VOLTAGE-FREQUENCY CONVERTERS

CROSS-REFERENCE TO RELATED APPLICATIONS AND PUBLICATIONS

Journal Elektronik, 1978, Vol. 9, Pages 80–82, 90.

The present invention relates to frequency-voltage converters as well as voltage-frequency converters.

BACKGROUND AND PRIOR ART

A known converter is described in the first cross-referenced publication. This converter includes a counter which counts signals having a high fixed frequency. For each count, a particular output of the counter is activated. The reset input of a flip-flop is connected to each counter output, the flip-flops being set jointly in response to each pulse in the input pulse sequence whose frequency is to be converted to a voltage. The same input pulse resets the counter. The flip-flop outputs are connected through resistors having appropriate resistance values to a circuit point at which the currents supplied through the resistors are added. This known converter has a characteristic curve of voltage vs. frequency which is a logarithmic curve and which is not adjustable.

THE INVENTION

It is an object of the present invention to furnish a frequency-voltage converter wherein the characteristic curve can easily be adjusted in accordance with then-present requirements. In accordance with the invention, each of the partial signal sources (current sources) is selectively energized or de-energized in dependence upon the information stored in a corresponding one of the storage elements. If the time of the leading edge of one of the input pulses whose frequency $f_x$ is to be converted to a voltage is considered $T=0$, then means are provided for changing the information stored in the storage elements at times $T=t_i$ where $t_i=1/f_i$ and $f_i$ is the frequency at which a break is present in the characteristic curve. Since the total output signal (voltage) can be either increased or decreased at each break frequency, the system has great flexibility. Points of inflection in the characteristic curve can be created by causing portions of positive curvature to be adjacent to portions of negative curvature.

Characteristic curves of voltage vs. frequency which have a negative slope can be created by use of partial current sources which have currents of opposite polarity relative to each other. Various combinations of increasing and decreasing characteristic curves as a function of frequency can be achieved.

Further variations of the inventive idea may be achieved by the manner in which a current source is de-energized. This is achieved either by opening a switch in series with a resistor or by connecting one end of the resistor to ground potential. In the latter case, currents flowing from other current sources may, in part, flow across this resistor also.

The times $T_i$ at which the number of energized current sources is changed are determined in accordance with two preferred embodiments of the invention. In the first, means are provided for creating a series of timing pulses ft and a "1" or a "0" is shifted into a shift register in response to each timing pulse. One or more current sources may be energized for each condition of the shift register. In the second embodiment, a high fixed frequency fst is applied to a counter which is reset by, for example the leading edge, of the input pulse sequence $f_x$. Each count on the address counter addresses a different storage location in a storage, each of the storage locations holding a word having a number of bits equal to the number of current sources. Since a different storage location is addressed by each pulse in the sequence fst, a number of storage locations, namely the number required for reaching time $T_i=1/f_i$ will have the same bit content. At the various times $T_i$, the bit content of the addressed words changes. Since these changes can be arbitrary, a very flexible system results. If a still greater flexibility is desired, one of the resistors forming part of a current source can be a variable resistor so that the current delivered by the current source can also be arbitrarily changed. It should further be noted that the partial signal sources need not be either pure current sources or pure voltage sources.

In the first preferred embodiment, wherein the timing pulse sequence is utilized, changes in the break point are carried out by changes in the timing pulse sequence. When the partial signal sources are energized by the bits in different storage locations in an addressable storage, the changes in the break point can be accomplished either by changing the address programming, that is the counts on the address counter at which storage locations having a different storage content are addressed, or, alternatively, by replacing the particular storage unit with another. Each storage to be used in this embodiment must have a number of addresses which is at least equal to the number of pulses in the pulse sequence fst which will occur during one period $T_x=f_x$ where $f_x$ is the lowest possible frequency to be converted.

Voltage-frequency converters can be constructed using the frequency-voltage converters of the present invention. Such voltage-frequency converters also have an adjustable characteristic curve. The adjustment of the break points and the slopes of the curve are carried out only by use of digital circuits and with variable resistors, the accuracy of each of these components being determined with respect to the required accuracy of the overall circuit.

The converters of the present invention can also be used to correct the characteristic curves of measuring instruments or sensors such as temperature-dependent resistors whose characteristic curves are not desirable for a given application. Such measuring instruments can, for example, include indicators whose output signal is the position of a pointer relative to a dial. The conventional adjustment or compensation of the sensor or a circuit connected thereto to create the desired characteristic curve can be replaced by a frequency-voltage converter, a voltage-frequency converter, or a connection of two converters to form a frequency-frequency converter or a voltage-voltage converter having the desired characteristic curve designed to compensate for the deficiencies in the characteristic curve of the sensor or measuring instrument. These circuits will not, of course, change the actual characteristic curve of, for example, the temperature-dependent resistor, but will alter the signal, for example voltage, derived by use of such a resistor.

DRAWING DESCRIBING PREFERRED EMBODIMENTS

DESCRIPTION OF THE PREFERRED EMBODIMENT

Figure 1:
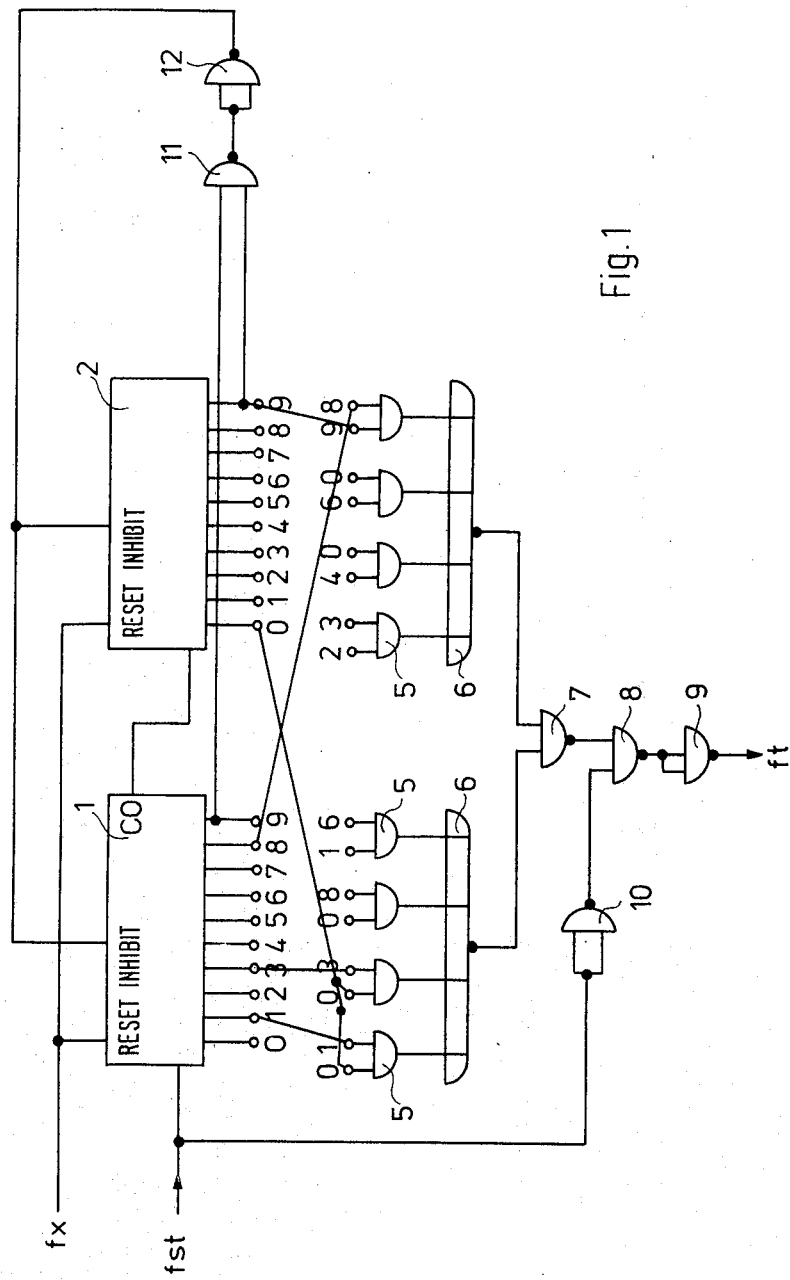
FIG. 1 is a schematic diagram illustrating a timing pulse generator for use in the present invention.

In FIG. 1, two Johnson counters 1 and 2 are provided, each having ten counting outputs, only one of which is activated for each count on the counters. Counter 1 has a counting input receiving a sequence of counting pulses, fst. After ten counting pulses, counter 1 is reset to zero and, simultaneously, furnishes a carry signal which is connected to the counting input of counter 2. Each carry signal from counter 1 therefore advances the count on counter 2 by one unit. A plurality of AND gates 5 are provided, each having two inputs. One of the inputs is connected to one output of counter 1, while the other is connected to an output of counter 2. For example, AND gate 5 in the left-most position in FIG. 1 has a first input connected to the "1" output of counter 1 and a second input connected to the "0" output of counter 2. AND gate 5 at the right-most position of FIG. 1 has a first input connected to the "8" output of counter 1 and a second input connected to the "9" output of counter 2. Since each input of the AND gates in FIG. 1 is labelled with the counter output to which it is connected, all of these connections will not be recited here. The AND gate outputs are connected to inputs of NOR gates 6 whose outputs in turn are connected to the inputs of a NAND gate 7. The output of NAND gate 7 is connected to one input of a NAND gate 8 whose other input is connected, through an inverter 10, to receive the counting pulse sequence fst. NAND gate 8 therefore synchronizes the outputs of AND gates 5 to the counting pulse sequence. The timing signals ft are provided at the output of an inverter 9 whose input is connected to the output of NAND gate 8. The timing signal thus appears whenever one of AND gates 5 furnishes an output signal. In the example illustrated in FIG. 1 this is true when counters 1 and 2 have received 1, 3, 8, 16, 23, 40, 60 and 98 pulses of the counting pulse sequence.

When counters 1, 2 reach the count of 99, a NAND gate 11 furnishes an output signal which is applied through an inverter 12 to the inhibit inputs of counters 1 and 2. The counters therefore stop counting. A resetting to "0" of the counters takes place in response to a pulse of the input pulse sequence $f_x$ which is to be converted into a voltage. It should be noted that the frequency fst is much higher than the highest frequency $f_x$ to be converted to a voltage. Counters 1 and 2 may be formed by integrated circuits CD 4017 of RCA.

Figure 2:
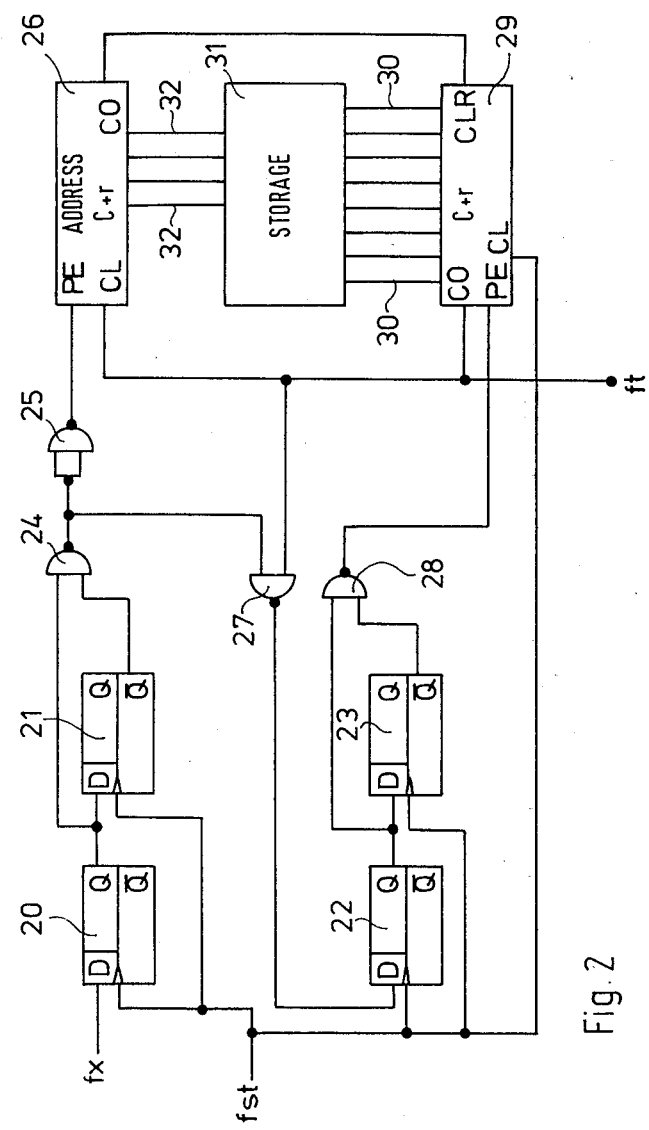
FIG. 2 is an alternate embodiment of the timing pulse generator shown in FIG. 1.

An alternate form of a timing signal generator is shown in FIG. 2. Here four D flip-flops 20, 21, 22, and 23 are provided, each having a clock input receiving the counting pulse frequency fst. The frequency $f_x$ is applied to the D input of flip-flop 20. The Q output of flip-flop 20 is connected to the D input of flip-flop 21 and is also connected to one input of a NAND gate 24. The other input of NAND gate 24 is connected to the $\overline{Q}$ output of flip-flop 21. The output of NAND gate 24 is connected through an inverter 25 to the preset input of counter 26 which is herein used as a reset input. The output of NAND gate 24 is further connected to one input of a NAND gate 27 whose output is connected to the D input of flip-flop 22. The Q output of flip-flop 22 is connected to the D input of flip-flop 23, as well as to one input of a NAND gate 28. The other input of NAND gate 28 is connected to the inverting output of flip-flop 23, while its output is connected to the preset input of a counter 29. The clock input of counter 29 receives the fixed frequency fst. The preset inputs of counter 29 are connected through lines 30 to the outputs of an addressable storage 31. The address inputs of storage 31 are connected through lines 32 with the address outputs of an address counter 26. Storage 31 has a plurality of storage locations each storing a count to which counter 29 is to be preset. Counter 29 is thereby preset to a particular number and then proceeds to count downwards from this count at a frequency fst until it reaches a predetermined count, such as zero. At this point a pulse is generated at the carry output CO of counter 29. The pulse at the carry output is applied to the second input of NAND gate 27 as well as to the clock input of address counter 26. Address counter 26 is thus advanced by one count. The carry pulse applied to the second input of NAND gate 27 causes this pulse to be synchronized, in flip-flops 22 and 23 and gate 28, with a pulse of the pulse sequence fst. The so-synchronized pulse is applied to a preset control input of counter 29 so that, upon receipt of the synchronized pulse, counter 29 is preset to the value stored in the address storage location of storage 31. A new address was previously generated in counter 26 in response to the pulse applied to its clock input.

A total of sixteen addresses is stored in address counter 16. After receiving the sixteenth pulse at its clock input, address counter 26 furnishes a carry signal at its carry output CO which blocks counter 29. The next positive going edge of one of the pulses $f_x$, after synchronization to the fst frequency by flip-flops 20 and 21 causes address counter 26 to be reset; counter 29 is again preset and a new timing pulse sequence appears at the output CO of counter 29. When the counting pulse sequence fst has a constant frequency, the time between timing pulses ft depends upon the count to which counter 29 was preset, that is how many counting signals it must receive until a signal appears at its carry output. The time intervals between individual pulses in the sequence ft is determined by the final count at which counter 29 furnishes the carry signal and by the value of the addresses stored in storage 31. The time intervals are always multiples of the time interval between two consecutive pulses of the frequency fst. An integrated circuit CD 4029 can be used for address counter 26, while counter 29 may be embodied in a circuit CD 40103 (RCA) and storage 31 can be constituted by EPROM 2716 (Intel).

Figure 3:
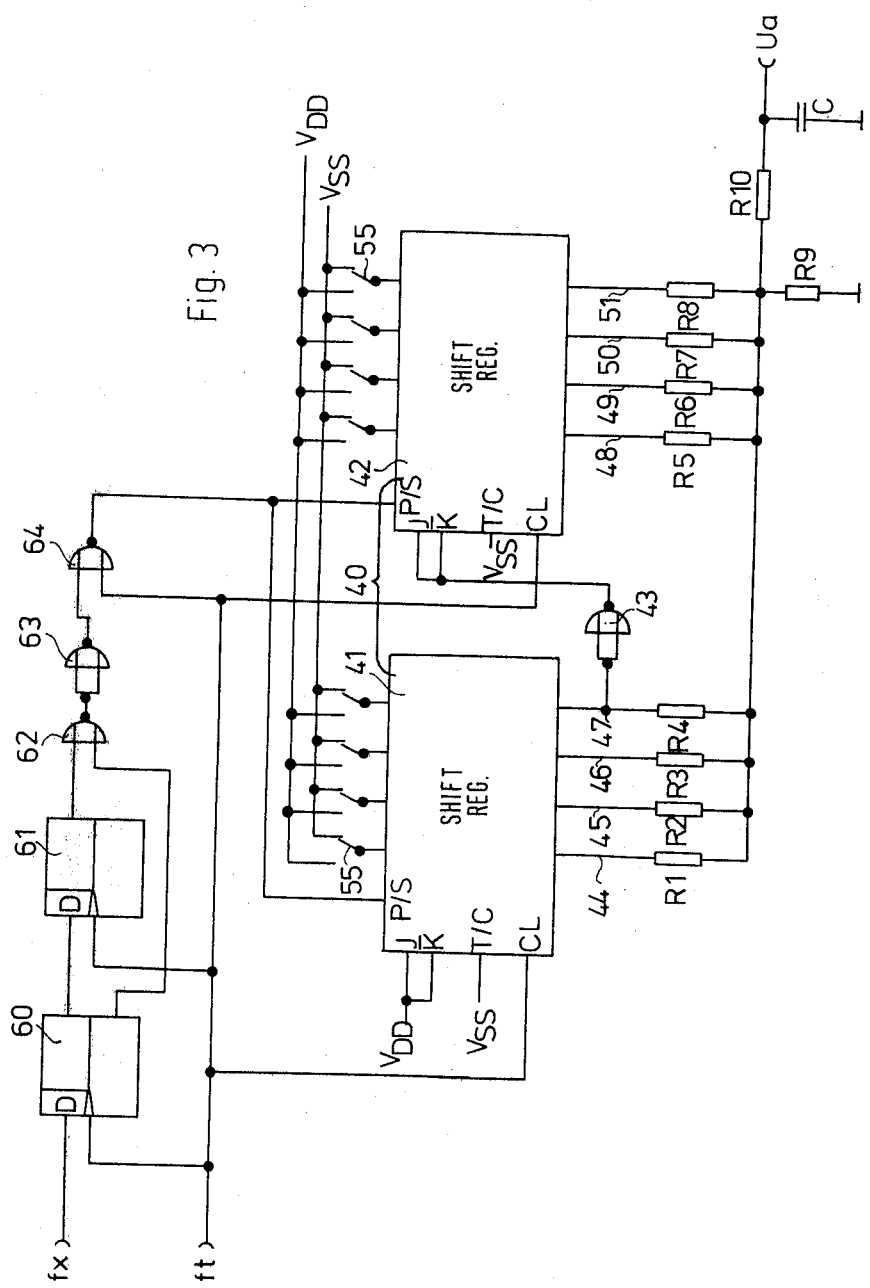
FIG. 3 is a schematic diagram illustrating a frequency-voltage converter utilizing a shift register.

The two above-described timing signal generators have been shown to furnish a timing pulse sequence of frequency ft, the distances between sequential pulses of which may be arbitrarily selected. In the embodiment of FIG. 1, the timing pulse sequence includes eight pulses, while the embodiment of FIG. 2 generates a pulse sequence ft of sixteen pulses, because of the sixteen possible outputs of counter 26. Referring now to FIG. 3, let it first be assumed that the timing pulse sequence ft applied thereto is a pulse sequence having at the most eight pulses; that is, the input labelled ft in FIG. 3 is connected to the output of the timing signal generator of FIG. 1. The pulses in pulse sequence ft act as shift pulses for a shift register 40 which consists of two integrated circuits 41 and 42. Specifically, a signal shifted out of circuit 41 is connected through an inverter 43 to an input of circuit 42. Shift register 40 consists of eight storage elements and has, correspondingly, eight signal outputs, 44–51. Integrated circuits CD 4035 (RCA) are used for circuits 41 and 42. A set of switches 55 is provided which allows either a positive voltage VDD or ground potential VSS to be applied to the different stages in shift register 40 in accordance with the desired characteristic curve. A corresponding "1" or "0" signal is then applied to the particular storage element in the shift register. Flip-flops 60 and 61 together with gates 62–64 constitute a synchronizing circuit, wherein each of the pulses in the incoming pulse sequence $f_x$ is synchronized to the pulses in the timing pulse sequence of frequency ft. Each so-synchronized pulse, that is each pulse at the output of gate 64, causes the storage elements in shift register 40 to be set to the value determined by the corresponding switch 55. Outputs 44–52 are then at either ground potential or at the positive potential, depending upon the setting of the switch 55. Resistors R1 through R8 are connected to respective outputs of shift register 41. Selected ones of resistors R1 through R8 will therefore carry current, the so-furnished currents being summed in the resistor R9 one of whose ends is connected to ground potential. The voltage across resistor R9 is filtered by a low pass filter including a resistor R10 and a capacitor C. The filtered output voltage across capacitor C is the voltage Ua whose average value corresponds to the frequency $f_x$. Flip-flops 60 and 61 may be constituted by integrated circuit CD 4013 (RCA).

As an example, it may be assumed that for each pulse in the incoming pulse sequence $f_x$ a "1" is stored in each position in the shift register 40. Eight sequential pulses of frequency ft then cause the contents of the shift register to be reduced to zero. Correspondingly, the voltage across resistor R9 is reduced step by step causing the characteristic curve of the converter to increase at first at a high rate and then later at a lower rate. Resistor R9 may be omitted, since the shift register outputs switch between VDD and VSS.

Figure 4:
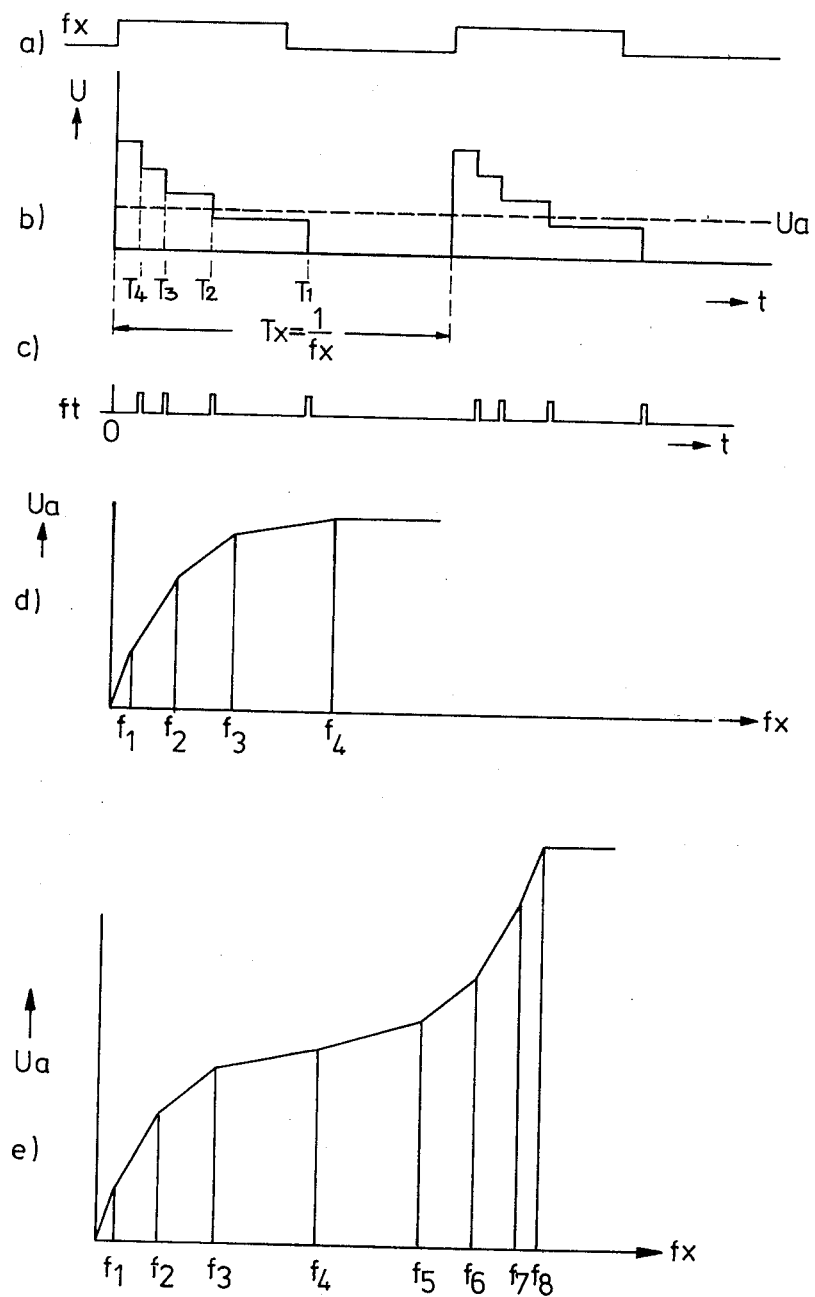
FIG. 4 shows timing diagrams for illustrating the operation of a frequency-voltage converter according to the present invention.

The above-described operation will be described with reference to FIG. 4 where it is, however, assumed that shift register 40 only has four storage elements, all being initially set to a "1". The bits shifted into the shift register each are a "0", which, in the embodiment shown in FIG. 3, is accomplished by applying a positive potential to inputs J and $\overline{K}$. If a potential VSS is now applied to the T/C (true/complement) input the outputs of the shift register will carry the complement of the value stored in the storage location associated therewith. As long as frequency $f_x$ is smaller than frequency $f1 = 1/T1$, all pulses of the frequency ft arrive at the shift register prior to the next pulse in the pulse sequence having the frequency $f_x$ and, therefore, the voltage across resistor R9 varies as shown in FIG. b. Such a relatively low frequency $f_x$ is illustrated in FIG. 4a. If the frequency $f_x$ is larger than f1, the next pulse in the pulse sequence $f_x$ which causes the resetting of shift register 40 arrives before the fourth timing pulse has been applied to shift register 40. The stepwise decrease in voltage across resistor R9 thus does not continue until the zero voltage value is reached. If the frequency $f_x$ increases until it exceeds $f4 = 1/T4$, then not even the first pulse in the sequence ft will be applied to the shift register and therefore no shifting at all takes place between sequential pulses in the pulse sequence $f_x$. The output voltage Ua then remains constant for all frequencies $f_x$ which exceed f4. As shown in FIG. 4c, the first pulse in the pulse sequence having the frequency ft following a pulse of the frequency $f_x$ causes the first stepwise decrease in the curve of FIG. 4b, that is it arrives at a time interval $T4 = 1/f4$ relative to the time origin, that is relative to the leading edge of one of the pulses in the pulse sequence $f_x$. Similarly, the fourth timing pulse arrives at a time interval relative to the same origin which is equal to $T1 = 1/f1$. It might be mentioned at this point that for particular embodiments of shift register 40 it may be necessary to apply a timing pulse to cause the content of switches 55 to be transferred into the shift register locations at time $T = 0$ in FIG. 4c, that is simultaneously with the leading edge of a pulse in the pulse sequence having the frequency $f_x$. This, however, is not to be considered a timing pulse in the sense of the present invention.

A characteristic curve such as that shown in FIG. 4d can also be generated with the eight-place shift register 40 in the following manner:

for each input pulse $f_x$, the value "1" is stored in all of the storage elements of shift register 40. The circuit shown in FIG. 3 is modified in that the inverter, which was effectively inactivated by the circuit of FIG. 3 because of the voltage applied to the T/C input is now activated so that every value shifted from the fourth place in building block 41 is inverted before being shifted into the first place in building block 42. Further, a "0" is shifted into the first position in the register in response to each timing pulse. Therefore after four timing pulses the total shift register content is 0 since "0"s are stored both in unit 41 and in unit 42 because of the inverting of the signal shifted from unit 41 to unit 42. If the so-modified arrangement is driven with at the most four timing signals (ft) then a characteristic curve similar to that shown on FIG. 4d results. If, however, the same arrangement is driven by eight timing pulses for each of the pulses in pulse sequence $f_x$, then the voltage across resistor R9 will again begin to increase upon receipt of the fifth timing pulse, since, although "0" signals continue to be shifted into unit 41, the "0" signals shifted out of unit 41 into unit 42 will have the value "1". Current will therefore start to flow through resistors R5 through R8. The characteristic curve shown in FIG. 4e results. This characteristic curve has a point of inflection.

Figure 5:
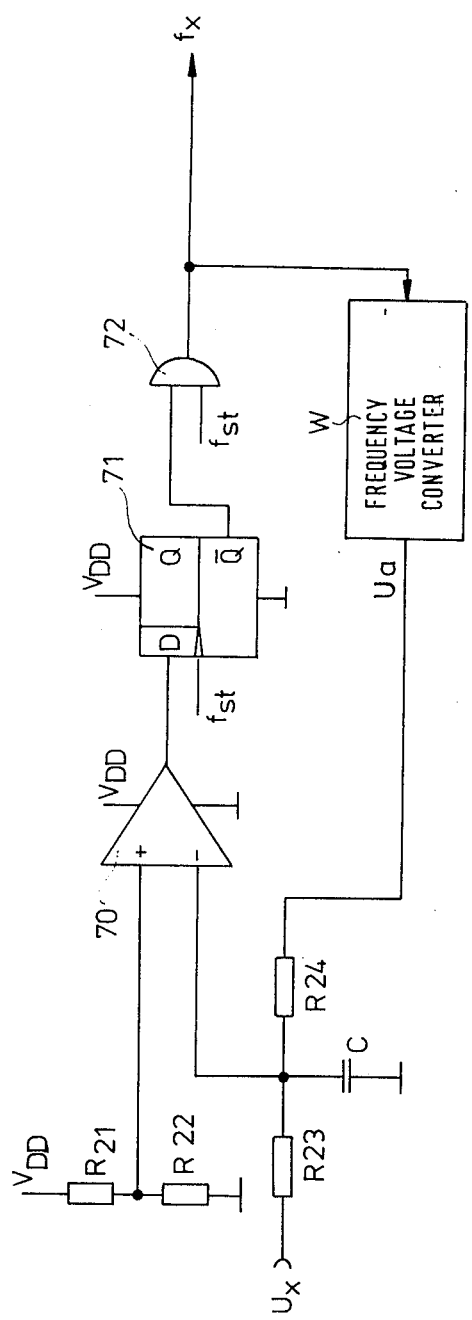
FIG. 5 is a schematic diagram showing a voltage-frequency converter utilizing the frequency-voltage converter of the present invention.
Figure 6:
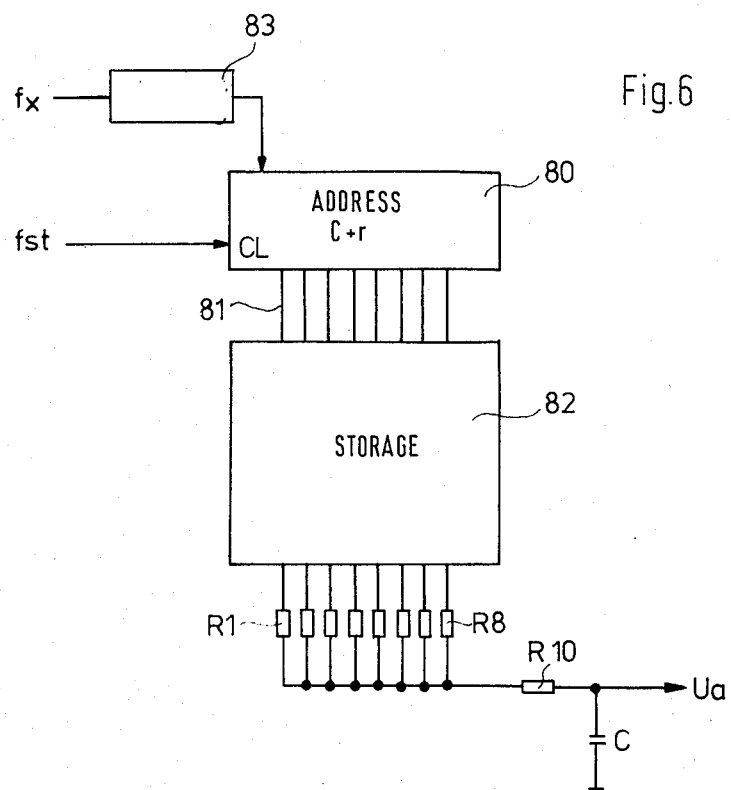
FIG. 6 shows an alternate embodiment of a frequency-voltage converter.

A voltage-frequency converter is illustrated in FIG. 5. It comprises a comparator 70 which has a positive input connected to the common point of two resistors R21 and R22. The negative input of comparator 70 is connected to the common point of resistors R23 and R24 and is also connected to ground potential through a capacitor C. The voltage $U_x$ to be converted to a frequency is applied to resistor R23 while the output voltage of a frequency-voltage converter as shown, for example, in FIG. 3 is applied to resistor R24. The polarities of voltages $U_x$ and $U_a$ (the output voltage of frequency-voltage converter W) is such that the difference between the two voltages appears at the common point of resistors R23 and R24. This difference is therefore applied to the negative or inverting input of comparator 70. Comparator 70 furnishes an output signal when the voltage applied to its positive input has an amplitude exceeding that of the voltage applied to its negative input. The output of comparator 70 is applied to the D input of a D flip-flop 71 whose $\overline{Q}$ output is applied to one input of an AND gate 72. A signal of clock frequency fst is applied to the clock input of flip-flop 71 and a second input of AND gate 72. A signal $f_x$ which is synchronized to the clock signal frequency fst therefore appears at the output of AND gate 72. This pulse sequence is also applied to the input of frequency-voltage converter W. The clock signal of frequency fst is also applied to the frequency-voltage converter W as explained relative to FIGS. 1 and 3. The converter shown in FIG. 5 automatically regulates until the voltage $U_a$ is equal to the input voltage $U_x$ and, when this condition is reached, the frequency $f_x$ appearing at the output of the voltage-frequency converter corresponds exactly to the value of the applied voltage $U_x$ in accordance with the characteristic curve. In the arrangement shown in FIG. 6, an address counter 80 is provided whose output lines 81 are connected to the address inputs of a storage 82. The outputs of storage 82 are connected through resistors R1 through R8 to one terminal of a resistor R10 whose other terminal is connected through a capacitor C to ground potential. The voltage at the common point of resistor R10 and capacitor C is the desired output potential $U_a$. Address counter 80 has a reset input which receives the pulses having the frequency $f_x$ after the latter have passed through a synchronization circuit 83. Address counter 80 is thus reset for each pulse in the pulse sequence having the frequency $f_x$ just as address counter 26 was reset for each signal appearing at its input PE. A clock pulse frequency fst is applied to the clock input CL of the address counter. An integrated circuit SCL4404 can be used as the address counter 80. Storage 82 may be constituted by an EPROM 2716 (Intel) and has a capacity of 2,048 words of eight bits each. If the arrangement of FIG. 6 is to be used to construct a characteristic curve as shown in FIG. 4b, then the binary words in the storage locations of storage 82 are so chosen that, starting at time T=0, that is in response to the leading edge of one of the pulses of pulse sequence $f_x$, the same relatively high number of current sources is energized up to time T=T4. A relatively high voltage $U_a$ is therefore generated until time T4. At that time, the total count is decreased somewhat and is then held constant until time T3. The same process then repeats until, after time T1 the current has been decreased to value 0. This system is particularly flexible, since the words stored in each storage location can be arbitrarily selected. If the number of binary "1" signals in the bits of each word determine the number of energized current sources and if, in addition, the current furnished by each current source depends also upon the position within the word of the particular bit, then very strong changes in total current can be made within a very short time that is, for predetermined pulses in the sequence fst. Such large changes are much more difficult to achieve with shift register arrangements such as that shown in FIG. 3.

Figure 7:
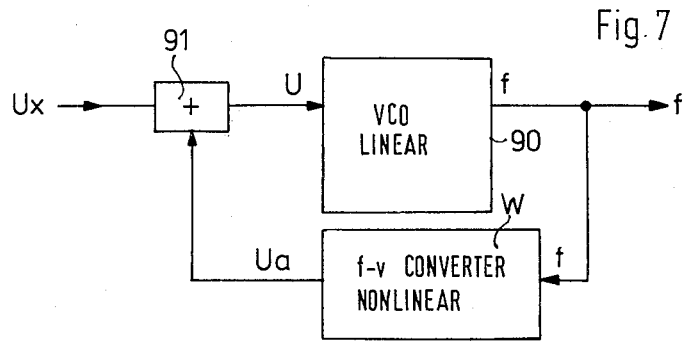
FIG. 7 shows an alternate embodiment of a voltage-frequency converter.

FIG. 7 is a very generalized block diagram of a voltage-frequency converter. The circuit includes a voltage controlled oscillator, that is a voltage-frequency converter 90 having a linear characteristic. Such circuits are well known. Further, a frequency-voltage converter W in accordance with the present invention is applied which has a nonlinear characteristic curve. The output of the voltage-frequency converter 90 is connected to the frequency input of the frequency-voltage converter W. The output of converter W is connected to one input of an adder circuit 91 whose other input receives the voltage $U_x$ which is to be converted to a frequency. The output of adder circuit 91 is connected to the input of the VCO 90. The desired frequency is derived from the output of VCO 90. It should be noted that care must be taken that the arrangement operates in a stable state. For example, it may be necessary to provide a subtraction circuit rather than an adder circuit 91 or, alternatively, it may be necessary to invert the output signal of converter W.

In the above-described converters, all of which have characteristic transfer curves having break points, the position of each break is given either by a variable programable sequence of timing pulses (FIGS. 1 and 2) or by the sequence of values stored in storage locations in a storage which is addressed at a relatively high constant clock frequency fst (FIG. 6). The slope of the transfer curve in all cases is determined by the amplitude of the current or voltage energized at each step.

Various changes and modifications may be made within the scope of the invention concepts.

We claim:

1. In equipment furnishing an output signal varying in dependence upon the frequency $f_x$ of an applied input pulse sequence, in accordance with a characteristic curve having a break at at least one predetermined frequency $f_i$, said equipment having a plurality of partial signal supply means (40, $R_1$-$R_8$) for furnishing partial signals having predetermined amplitudes in response to timing signals applied thereto, and means ($R_9$) for combining said partial signals thereby creating said output signal:

apparatus for furnishing said timing signals said apparatus comprising cyclically operable means (1, 2; 26) for furnishing a sequence of first signals in response to each input pulse in said input pulse sequence; and means (5-9; 31, 29) connected to said cyclically operable means for furnishing said timing signals in response to the one of said first signals occurring at time $Ti = 1/f_i$ following each of said input pulses;

wherein said means for furnishing a sequence of first signals comprises means for furnishing a sequence of counting pulses at a frequency substantially exceeding said frequency of said applied input pulse sequence, and counting means (1, 2) connected to receive said counting pulse sequence and said input pulse sequence, for counting said counting pulses from receipt of each of said input pulses and furnishing counting output signals corresponding to the number of so-counted counting pulses, said counting signals constituting said sequence of first signals;

wherein said counting means comprises an address counter (26) furnishing address signals corresponding to the number of so-counted counting signals; and wherein said means for furnishing said timing signals comprises storage means (31) connected to said address counter means for furnishing preset signals in response to said address signals, and additional counter means (29) connected to receive said preset signals, said input pulse sequence and said counting pulse sequence so that said additional counter means is preset to a count corresponding to said preset signals, counts in a predetermined counting direction from said preset count to a predetermined final count and furnishes one of said timing signals upon reaching said predetermined final count.

2. Equipment as set forth in claim 1, wherein said means for furnishing said timing signals comprises decoding means (5-9) connected to said counting means for selecting predetermined ones of said counting signals to constitute said timing signals.

3. Equipment as set forth in claim 1, wherein said address counter is reset in response to each of said input pulses, has a shift input for receiving said timing signals and furnishes a carry signal following receipt of a predetermined number of said timing signals;

and wherein said additional counter has a blocking input for receiving said carry signal, whereby said additional counter stops counting upon receipt of said carry signal.

4. Voltage-frequency converter comprising frequency-voltage converter means for furnishing an output signal varying in dependence upon an input signal frequency in accordance with the characteristic curve having a break at at least one predetermined frequency, said frequency-voltage converter means having a plurality of information storage elements, a plurality of means operative only when activated for supplying partial signals, means connected to said partial signal supply means for furnishing said output signals in dependence upon the so-supplied partial signals, and means for connecting said partial signal supply means to said information storage elements so that said partial signal supply means is activated in accordance with information stored in said information storage elements;

means for furnishing an input voltage ($U_x$) to be converted to an output frequency;

means for comparing said input voltage to said output signal furnished by said frequency-voltage converter means and furnishing a comparator output signal when said input voltage exceeds said output signal; and means for applying said comparator output signal to the input of said frequency-voltage converter means, whereby said comparator output signal occurs at a frequency corresponding to said input voltage.

5. Voltage-frequency converter as set forth in claim 4 further comprising synchronizing circuit means (71, 72) interconnected between said comparator means and said frequency-voltage converter means, said synchronization circuit means having an output furnishing said output signal.

* * * * *